(12) United States Patent
Zhong et al.

(10) Patent No.: US 11,083,107 B2
(45) Date of Patent: Aug. 3, 2021

(54) ELECTRONIC DEVICE AND POWER MODULE THEREOF

(71) Applicant: Delta Electronics (Shanghai) Co., Ltd., Shanghai (CN)

(72) Inventors: Yuanyuan Zhong, Shanghai (CN); He Li, Shanghai (CN)

(73) Assignee: DELTA ELECTRONICS (SHANGHAI) CO., LTD., Shanghai (CN)

( * ) Notice: Subject to any disclaimer, the term of this patent is extended or adjusted under 35 U.S.C. 154(b) by 0 days.

(21) Appl. No.: 16/727,959

(22) Filed: Dec. 27, 2019

(65) Prior Publication Data

US 2020/0214174 A1 Jul. 2, 2020

(30) Foreign Application Priority Data

Dec. 29, 2018 (CN) .......................... 201822252297.7

(51) Int. Cl.
*H05K 7/20* (2006.01)
*H05K 1/18* (2006.01)
(Continued)

(52) U.S. Cl.
CPC ..... *H05K 7/20409* (2013.01); *H01L 23/3675* (2013.01); *H01L 23/4006* (2013.01);
(Continued)

(58) Field of Classification Search
CPC ....... H01L 2924/14; H01L 2924/19105; H01L 24/00; H05K 1/141; H05K 2201/10166; H05K 1/144; H05K 3/0061; H05K 7/2039; H05K 7/2089; H05K 2201/066; H05K 3/366; H05K 1/0203; H05K 1/0204; H05K 1/148; H05K 2201/10272;
(Continued)

(56) References Cited

U.S. PATENT DOCUMENTS 4,707,726 A * 11/1987 Tinder ................ H01L 23/4006
165/80.1
4,888,637 A * 12/1989 Sway-Tin ........... H01L 23/4006
174/252

(Continued)

FOREIGN PATENT DOCUMENTS

CN 202455714 U 9/2012
CN 203015370 U 6/2013

*Primary Examiner* — Stephen S Sul
*Assistant Examiner* — Michael A Matey
(74) *Attorney, Agent, or Firm* — CKC & Partners Co., LLC (57) ABSTRACT

The present utility model provides an electronic device and a power module thereof. The power module of the present utility model includes: a first circuit board, a second circuit board, a radiator and a power device; where the heat dissipation surface of the power device is in thermal contact with the radiator, and the heat dissipation surface of the power device is parallel to the first surface of the first circuit board. The present utility model improves the heat dissipation efficiency of the power device by mounting the power device on the second circuit board and thermally contacting the radiating surface of the power device with the radiator, and at the same time, the arrangement of the second circuit board also makes the assembly of the entire power module more convenient.

19 Claims, 4 Drawing Sheets

(51) Int. Cl.
  *H05K 1/02* (2006.01)
  *H01L 23/40* (2006.01)
  *H01L 23/367* (2006.01)

(52) U.S. Cl.
  CPC .......... *H05K 1/0209* (2013.01); *H05K 1/181* (2013.01); *H05K 2201/10053* (2013.01)

(58) Field of Classification Search
  CPC ....... H05K 2201/10545; H05K 1/0209; H05K 1/14; H05K 1/181; H05K 1/0201; H05K 1/021; H05K 1/142; H05K 1/145; H05K 1/184; H05K 2201/042; H05K 2201/044; H05K 2201/048; H02M 7/003; G06F 1/189; G06F 1/183
  See application file for complete search history.

(56) References Cited

U.S. PATENT DOCUMENTS

| | | | | |
|---|---|---|---|---|
| 5,450,284 A * | 9/1995 | Wekell | ................ | H01L 23/4006 257/719 |
| 5,545,924 A * | 8/1996 | Contolatis | ............... | H01L 23/66 257/724 |
| 6,332,792 B1 * | 12/2001 | Lin | ...................... | H05K 7/1431 439/160 |
| 6,418,021 B1 * | 7/2002 | Itabashi | .............. | H01L 23/3675 361/704 |
| 6,984,887 B2 * | 1/2006 | Umezu | ................ | H01L 23/367 257/675 |
| 7,177,154 B2 * | 2/2007 | Lee | ........................ | G06F 1/181 165/104.33 |
| 8,670,239 B2 * | 3/2014 | Hasegawa | ............ | H05K 1/0203 361/717 |
| 9,166,489 B2 * | 10/2015 | Yan | ........................ | H02M 3/337 |
| 9,685,883 B2 * | 6/2017 | Huang | .................. | H02M 7/219 |
| 10,736,236 B2 * | 8/2020 | Engelhardt | ......... | H05K 7/20927 |
| 2004/0257769 A1 * | 12/2004 | Heirich | ............... | H01L 23/4006 361/704 |
| 2005/0061477 A1 * | 3/2005 | Mira | .................... | H01L 23/467 165/80.3 |
| 2005/0264998 A1 * | 12/2005 | McCutcheon | ...... | H01L 23/4006 361/702 |
| 2006/0012959 A1 * | 1/2006 | Lee | ........................ | H01L 23/427 361/700 |
| 2009/0080162 A1 * | 3/2009 | Lin | ....................... | H05K 1/0204 361/720 |
| 2011/0276191 A1 * | 11/2011 | Zushi | ........................ | G05B 9/02 700/293 |
| 2012/0151098 A1 * | 6/2012 | Sullivan | ................... | H05K 1/14 710/13 |
| 2013/0308275 A1 * | 11/2013 | Yamanaka | ........... | H05K 7/2039 361/717 |
| 2014/0035530 A1 * | 2/2014 | Shao | ....................... | B60L 53/11 320/109 |
| 2014/0198455 A1 * | 7/2014 | Masuda | ............... | H05K 7/2089 361/720 |
| 2014/0313626 A1 * | 10/2014 | Wang | ....................... | H02H 9/04 361/91.2 |
| 2016/0057891 A1 * | 2/2016 | Chang | ...................... | B23P 15/26 165/80.2 |
| 2017/0042053 A1 * | 2/2017 | Soyano | ................. | H05K 1/0298 |
| 2018/0077792 A1 * | 3/2018 | Horie | ...................... | H01F 27/40 |
| 2019/0281694 A1 * | 9/2019 | Chen | ................... | H05K 7/20909 |
| 2019/0305649 A1 * | 10/2019 | Ito | ........................ | H02M 5/458 |
| 2019/0380223 A1 * | 12/2019 | Hayashi | .................. | H05K 1/181 |
| 2020/0091033 A1 * | 3/2020 | Kobayashi | ........... | H01L 23/4093 |
| 2020/0168532 A1 * | 5/2020 | Ikeda | ...................... | H05K 7/06 |

* cited by examiner

ELECTRONIC DEVICE AND POWER MODULE THEREOF

CROSS-REFERENCE TO RELATED APPLICATION

This application claims priority to Chinese Patent Application No. 201822252297.7, filed on Dec. 29, 2018, entitled "ELECTRONIC DEVICE AND POWER MODULE THEREOF", which is incorporated herein by reference in its entirety.

TECHNICAL FIELD

The present utility model relates to the technical field of heat dissipation for an electronic device, in particular, to an electronic device and a power module thereof.

BACKGROUND

At present, a power device sealed in an electronic device housing is mostly cooled by a radiator. Since heat generated by the power device is significantly large, how to improve heat dissipation efficiency of the power device is especially important for ensuring the normal use of the electronic device. In the prior art, in order to make the radiator have a better heat dissipation effect on the power device, a L-shaped fin is generally required to be added. During assembly, the heat dissipation surface of the power device is closely attached to the heat dissipation surface of the L-shaped fin, to conduct heat to the radiator through the other surface perpendicular to the heat dissipation surface of the L-shaped radiator. However, since the heat dissipation path of the L-shaped fin is long, a good heat dissipation cannot be achieve, and at the same time, in order to fit with the L-shaped fin, the circuit board of the power device usually needs to be reversely mounted on the radiator, and the assembly process is complicated.

SUMMARY

The present utility model provides an electronic device and a power module thereof, which overcome problems in the prior art that the heat dissipation effect of the power device is poor and the assembly is complicated.

In a first aspect, the present utility model provides a power module including: a first circuit board, a second circuit board, a radiator and a power device;

the radiator is arranged on a first surface of the first circuit board, the second circuit board is mounted on a second surface of the first circuit board, and the first surface of the first circuit board and the second surface of the first circuit board are arranged oppositely;

the power device is perpendicularly inserted on a first surface of the second circuit board, and is electrically connected to the first circuit board by the second circuit board, and the first surface of the first circuit board is perpendicular to the first surface of the second circuit board;

where a heat dissipation surface of the power device is in thermal contact with the radiator, and the heat dissipation surface of the power device is parallel to the first surface of the first circuit board.

Optionally, the power device includes a switch tube, and the heat dissipation surface of the switch tube is in thermal contact with the radiator by an insulating thermal conductive gasket.

Optionally, the power module further includes a fastener, the fastener is configured to fix the switch tube to the radiator.

Optionally, the fastener includes a pressing part and a fixing part, the pressing part is at least partially pressed against and hold on one side of the switch tube facing away from the radiator, and the fixing part is configured to fix the pressing part to the radiator.

Optionally, the pressing part is a pressing strip; the fixing part is a bolt, and the bolt is fixed to the radiator by passing through the pressing strip.

Optionally, the fixing part is a bolt; the pressing part is an elastic piece, and the elastic piece includes a free end and a fastening end; the fastening end is fixed on the radiator by the bolt, and the free end is pressed against and hold on one side of the switch tube facing away from the radiator.

Optionally, the fastener is a screw, and the screw is fixed to the radiator by passing through the switch tube.

Optionally, a plurality of the switch tubes are arranged along a bottom edge of the first surface of the second circuit board.

Optionally, the interior of the first circuit board has an opening, at least of partial the heat dissipation surface of the power device extends into the opening.

Optionally, at least partial of the heat dissipation surface of the power device extends beyond an edge of the first circuit board.

Optionally, an edge of the first circuit board has an opening, at least partial of the heat dissipation surface of the power device extends into the opening.

Optionally, the second circuit board includes a power terminal, and the second circuit board is mounted on the second surface of the first circuit board by the power terminal and the second circuit board is electrically connected to the first circuit board.

Optionally, the second circuit board further includes a signal terminal for transmitting signals between the first circuit board and the second circuit board.

Optionally, the second circuit board further includes a fixing terminal for enhancing mechanical connection strength between the first circuit board and the second circuit board.

Optionally, one of the fixed terminals is disposed at each end of the second circuit board.

Optionally, the radiator has a protrusion, and the heat dissipation surface of the power device is in thermal contact with the top surface of the protrusion.

Optionally, the power module further includes a driving circuit, a sampling circuit and an absorbing circuit, and any one or more of the driving circuit, the sampling circuit and the absorbing circuit are arranged on the second circuit board.

Optionally, the power module further includes a control circuit and a bus capacitor, and the control circuit and the bus capacitor are arranged on the first circuit board.

In a second aspect, the present utility model provides an electronic device including the power module as described above.

The present utility model provides an electronic device and a power module thereof. The power module of the present utility model includes: a first circuit board, a second circuit board, a radiator and a power device; the radiator is arranged on a first surface of the first circuit board, the second circuit board is arranged on a second surface of the second circuit board, and the first surface of the first circuit board and the second surface of the first circuit board are arranged oppositely; the power device is perpendicularly inserted on a first surface of the second circuit board, and is electrically connected to the first circuit board through the second circuit board, and the first surface of the circuit board is perpendicular to the first surface of the second circuit board; where the heat dissipation surface of the power device is in thermal contact with the radiator, and the heat dissipation surface of the power device is parallel to the first surface of the first circuit board. The present utility model installs the radiator on the first surface of the first circuit board, installs the second circuit board on the second surface of the first circuit board and installs the power device on the second circuit board, so that the heat dissipation surface of the power device is in thermal contact with the radiator and the heat dissipation surface of the power device is parallel to the first surface of the first circuit board. This arrangement shortens the heat dissipation path of the power device and efficiently improves the heat dissipation efficiency of the power device, and at the same time, the arrangement of the second circuit board also makes the assembly of the entire power module more convenient, which further improves the work efficiency.

BRIEF DESCRIPTION OF THE DRAWINGS

In order to more clearly illustrate embodiments of the present utility model or technical solutions in the prior art, attached drawings required to be used in the embodiments or in description of the prior art will be briefly described below. Obviously, the attached drawings in the following description are some embodiments of the present utility model, and those skilled in the art can obtain other attached drawings according to those attached drawings without making creative labor.

DESCRIPTION OF THE REFERENCE NUMERAL

1: first circuit board;
11: opening;
2: second circuit board;
3: radiator;
31: protrusion;
4: power device;
41: switch tube;
5: insulating thermal conductive gasket;
6: power terminal;
7: signal terminal;
8: fixing terminal;
9: fastener;
91: pressing strip;
92: elastic piece;
93: bolt;
94: screw;
921: free end;
922: fastening end.

DESCRIPTION OF EMBODIMENTS

To make the purpose, technical solution and advantage of embodiments of the present utility model more clearly, the technical solution in the present utility model will be clearly and completely described in conjunction with the attached drawings in the embodiments of the present utility model in below. Obviously, the described embodiments are part of the embodiments of the utility model and not all of them. All other embodiments obtained by those skilled in the art based on the embodiments of the present utility model without making creative efforts shall fall into the protection scope of the present utility model.

At present, most of the power devices in electronic devices are sealed in a housing, and then dissipates heat through a radiator arranged on the back of the housing. Since the heat generated by the power device is significantly large, how to improve heat dissipation efficiency of the power device is especially important for ensuring the normal use of the electronic device.

In order to overcome problems in the prior art that the heat dissipation effect of the power device is poor and the assembly is complicated, the present embodiment provides a power module.

Embodiment I

Figure 1:
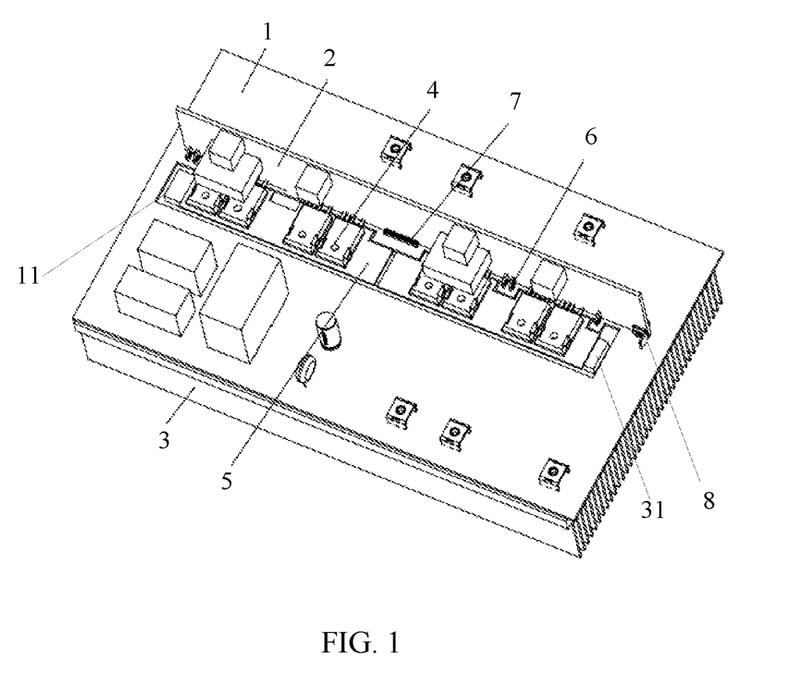
FIG. 1 is a schematic diagram of a first structural of the power module according to Embodiment I of the present utility model.
Figure 2:
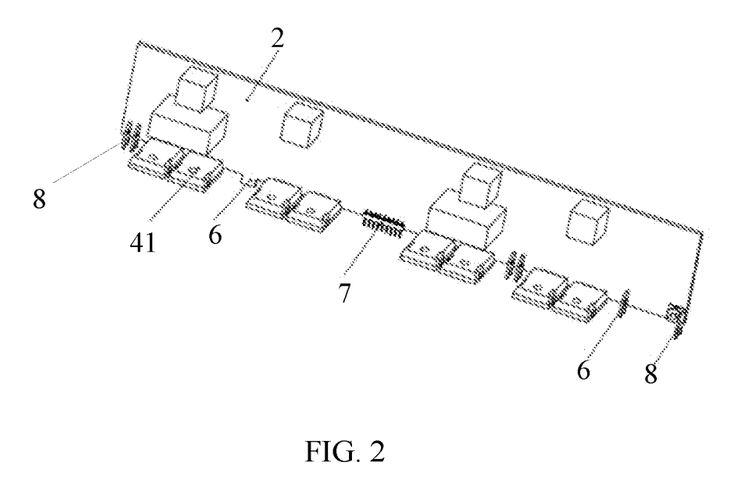
FIG. 2 is a schematic diagram of a structural of the second circuit board in the power module according to Embodiment I of the present utility model.
Figure 3:
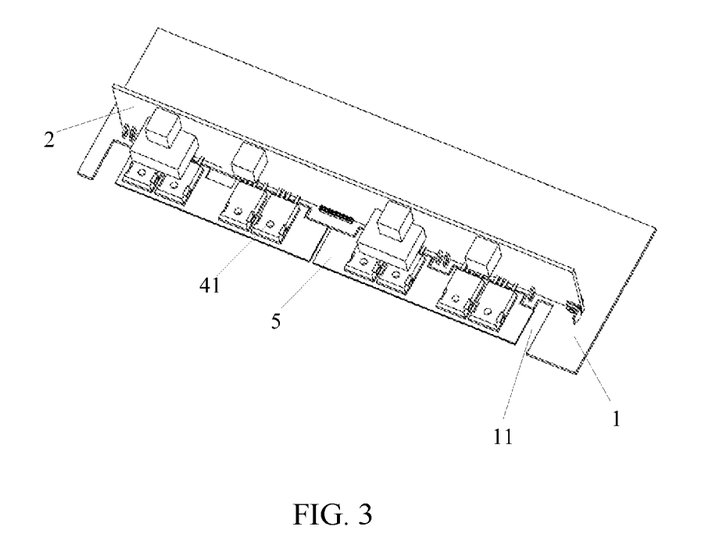
FIG. 3 is a schematic diagram of a second structural of the power module according to Embodiment I of the present utility model.

FIG. 1 is a schematic diagram of a first structural of the power module according to Embodiment I of the present utility model; FIG. 2 is a schematic diagram of a structural of a second circuit board in a power module according to Embodiment I of the present utility model; FIG. 3 is a schematic diagram of a second structural of the power module according to Embodiment I of the present utility model.

Referring to FIG. 1 to FIG. 3, the power module provided in Embodiment I includes: a first circuit board 1, a second circuit board 2, a radiator 3 and a power device 4; the radiator 3 is arranged on a first surface of the first circuit board 1; the second circuit board 2 is arranged on a second surface of the first circuit board 1, and the first surface of the first circuit board 1 and the second surface of the first circuit board 1 are arranged oppositely; the power device 4 is perpendicularly inserted on a first surface of the second circuit board 2, and the power device 4 is electrically connected to the first circuit board 1 through the second circuit board 2, and the first surface of the first circuit board 1 is perpendicular to the first surface of the second circuit board 2; where the heat dissipation surface of power device 4 is in thermal contact with the radiator 3, and the heat dissipation surface of the power device 4 is parallel to the first surface of the first circuit board 1.

Specifically, the first surface and the second surface of the first circuit board 1 refer to the upper surface and lower surface of the first circuit board 1, respectively, and the first surface of the first circuit board 1 and the second surface of the first circuit board 1 are arranged oppositely. The first surface of the second circuit board 2 refers to any one side perpendicular to the first surface of the first circuit board 1. In other words, the power device 4 can be arranged on any one side on the second circuit board 2 perpendicular to the first surface of the first circuit board 1.

Specifically, there are many ways for thermal contact between the heat dissipation surface of the power device 4 and the radiator 3 mounted on the first surface of the first circuit board 1, for example, in the present embodiment, as shown in FIG. 1 and FIG. 3, at least one opening is provided on the first circuit board 1, and the heat dissipation surface of the power device 4 is passed through the opening and then in thermal contact with the radiator 3; alternatively, in other embodiments, the second circuit board 2 is amounted on the edge of the first circuit board 1, and the heat dissipation surface of the power device 4 is extended beyond the first circuit board 1 to be in thermal contact with the radiator 3; alternatively, in another embodiments, when the thermal conductivity of the first circuit board 1 is better, the heat dissipation surface of the power device 4 can also be in thermal contact with the radiator 3 through the first circuit board 1, for example, when the first circuit board 1 is an aluminum substrate. It should be noted that those skilled in the art should be aware that a thermal conductive material, such as silicone grease, may be arranged on the heat dissipation path between the heat dissipation surface of the power device 4 and the radiator.

The power module in this embodiment shortens the heat dissipation path between the heat dissipation surface of the power device 4 and the radiator 3. Compared with the L-shaped radiator in the prior art, it can not only ensure that heat generated by the power device 4 can be effectively transferred to the radiator 3, but also improve the heat dissipation efficiency of the power module. At the same time, the fitting between the second circuit board 2 and the first circuit board 1 also makes the assembly between the power device 4 and the radiator 3 more convenient. Moreover, it is not necessary to bend the pins of the power device 4 by perpendicularly inserting the power device 4 on the second circuit board 2, which simplifies the installation process of the power module.

In this embodiment, the assembly process of the power module may be: after the power device 4 is first amounted on the first surface of the second circuit board 2, the second circuit board 2 is then mounted on the second surface of the first circuit board 1. The disassembly process of the power module of this embodiment may be a reverse process of the above assembly process. It can be seen from the above assembly process that for the power module of the present embodiment, on the basis of ensuring the heat dissipation effect of the power device 4, the assembly process between the power device 4 and the radiator 3 is more convenient than that of the L-shaped radiator in the prior art and also facilitates the disassembly and replacement of each part, and improves the assembly efficiency of the power module of this embodiment.

As shown in FIG. 2 and FIG. 3, in this embodiment, the power device 4 includes a switch tube 41. The effective heat dissipation of the switch tube 41 can make the overall temperature of the power module more balanced, and the switch tube 41 can be an insulated gate bipolar transistor, a bipolar transistor, an insulated gate field effect transistor, etc. In other application scenarios, the power device 4 may also include other power devices such as power diodes.

The power device 4 is provided with a plurality of the switch tubes 41, and the plurality of the switch tubes 41 are arranged along the bottom edge of the first surface of the second circuit board 2, so that the heat dissipation surface of the switch tube 41 is in thermal contact with the radiator 3. In order to ensure the insulation effect between each of the switch tubes 41 and the radiator 3, the insulating thermal conductive gaskets 5 may be arranged between each of the switch tubes 41 and the radiator 3, or one insulating thermal conductive gasket 5 may be arranged under all of the switch tubes 41, that is, all the switch tubes 41 share one insulating thermal conductive gasket 5, thereby reducing the number of parts, improving the assembly efficiency of the parts, and further saving the processing cost of the power module. Where the insulating thermal conductive gasket 5 can be arranged between the heat dissipation surface of the switch tube 41 and the first surface of the radiator 3. Where the first surface of the radiator 3 specifically refers to the surface of the radiator 3 facing the first surface of the first circuit board 1.

Further, the opening 11 may also be provided at the edge or inside the main circuit board 1 to make at least partial of the heat dissipation surface of the power device 4 extend into the opening 11, so that at least partial of the heat dissipation surface of the power device 4 can be in thermal contact with the radiator 3 mounted on the first surface of the first circuit board 1.

Specifically, in order to enable effective heat dissipation of the switch tube 41 having a large heat generation, the switch tube 41 in the power device 4 can be arranged facing the opening, and the heat dissipation surface of the switch tube 41 can be extended into the opening 11. Where since the power device 4 includes a plurality of switch tubes 41, and the plurality of switch tubes 41 are arranged along the bottom edge of the first surface of the second circuit board 2, in order to ensure that the heat dissipation surface of each of the switch tubes 41 is in thermal contact with the radiator 3 through the opening 11, the multiple openings 11 corresponding to each of the switch tubes 41 may be spaced on the first circuit board 1, so that each of switch tubes 41 extends into the respective opening 11 to be in thermal contact with the radiator 3. It is also possible to provide only one opening 11 on the first circuit board 1, and the length of the opening 11 is not less than the total length of all of the switch tubes 41 to ensure that the heat dissipation surface of each of the switch tubes 41 can extend into the common opening 11, that is, all of the switch tubes 41 share one opening 11. Where the switch tube 41 can be locked to the radiator 3 so as to make the connection between the radiator surface of the switch tube 41 and the radiator 3 more stable.

Referring to FIG. 1 and FIG. 3, in this embodiment, the second circuit board 2 can be mounted inside the second surface of the first circuit board 1, or can be mounted on the edge of the second surface of the first circuit board 1.

Specifically, when the second circuit board 2 is mounted inside of the second surface of the first circuit board 1, correspondingly, the power devices 4 arranged on the second circuit board 2 are also located inside the second surface of the first circuit board 1, and the above openings 11 are also correspondingly formed inside the second surface of the first circuit board 1. When the second circuit board 2 is mounted at the edge of the second surface of the first circuit board 1, at least partial of the heat dissipation surface of the power device 4 arranged on the second circuit board 2 also extends correspondingly beyond the edge of the first circuit board 1. Further, for ease of installation, the edge is correspondingly provided with an opening 11. In other words, the position of the opening 11 can be determined according to the position of the second circuit board 2 on the first circuit board 1, to ensure at least partial of the power device 4 can be in thermal contact with the radiator 3 arranged on the first surface of the first circuit board 1 through the opening 11. Where the second circuit board 2 is fixed to the edge of the first circuit board 1 in this embodiment to make the installation more convenient.

As shown in FIG. 1, when the distance from the power device 4 to the first surface of the radiator 3 is constant, in order to make the heat dissipation path between the heat dissipation surface of the power device 4 and radiator 3 shorter, a protrusion 31 can be provided on the first surface of the radiator 3 close to the first circuit board 1, such that the heat dissipation surface of the power device 4 is in thermal contact with the top surface of the protrusion 31 of the radiator 3, which effectively improves the heat dissipation efficiency of the power device 4. Further, when an opening 11 is arranged on the first circuit board 1, the protrusion 31 may be arranged in the opening, and at least partial of the heat dissipation surface of the power device 4 extends into the opening 11 and is in thermal contact with the top surface of the protrusion 31.

In this embodiment, the second circuit board 2 includes a power terminal 6, and the second circuit board 2 is arranged on the second surface of the first circuit board 1 through the power terminal 6 and is electrically connected to the first circuit board 1.

Specifically, the power device 4 on the second circuit board 2 realizes the exchange of power and electric energy of the first circuit board 1 via power terminal 6. Where the power terminal 6 and the second circuit board 2 may be integrally formed. For example, the power terminal 6 may be implemented in a manner of copper coating for the second circuit board 2, alternatively, the power terminal 6 may be a power connection, such as a copper bar and a connector clip, inserted on the second circuit board 2.

In this embodiment, the second circuit board 2 further includes a signal terminal 7 for transferring signals between the first circuit board 1 and the second circuit board 2.

When a signal circuit is provided on the second circuit board 2, the signals between the first circuit board 1 and the second circuit board 2 may be transferred through the signal terminal 7.

In order to achieve a stable connection between the second circuit board 2 and the first circuit board 1, the second circuit board 2 further includes a fixing terminal 8 for enhancing mechanical connection strength between the first circuit board 1 and the second circuit board 2.

Specifically, the second circuit board 2 and the first circuit board 1 are fixed by the fixing terminal 8, which effectively improves the connection strength between the first circuit board 1 and the second circuit board 2, reduces stress and avoids abnormal thermal contact between the heat dissipation surface of the power device 4 and the radiator 3 caused by unstable connection of the second circuit board 2 on the first circuit board 1, which affects the heat dissipation efficiency. In addition, when the power terminal 6 and the signal terminal 7 are connected between the second circuit board 2 and the first circuit board 1, the power terminal 6 and the signal terminal 7 are easily damaged if the connection between the second circuit board 2 and the first circuit board 1 is unstable, so that the signal between the first circuit board 1 and the second circuit board 2 cannot be normally transmitted. The further arrangement of the fixing terminal 8 ensures the heat dissipation effect of the entire power module and the stable operation of the power device 4.

The fixing terminal 8 serves as an additional connection between the second circuit board 2 and the first circuit board 1, it has various structures which are not limited herein, such as a detachable fixing part like a bolt or a clamping part, the number of the fixed terminals 8 may be plural, for example, one fixing terminal 8 is respectively arranged at both ends of the second circuit board 2, which further enhances the mechanical connection strength between the second circuit board 2 and the first circuit board 1.

The structure arrangement of both the first circuit board 1 and the second circuit board 2 in the power module of this embodiment enables the devices of the power module to be properly arranged inside the power module, and can ensure the heat dissipation effect of power device 4, so that the assembly and disassembly of the power device 4, the first circuit board 1, the second circuit board 2 and the radiator 3 are more convenient.

In other embodiments, the power module may further include circuit element such as a driving circuit, a sampling circuit, an absorbing circuit, a control circuit and a bus capacitor etc., and one or more of these circuit elements may be arranged on the first circuit board 1 or the second circuit board 2 according to actual conditions, to save the space occupied by the power module. In a specific implementation, the circuit elements which has smaller size and is electrically connected to and closes to the power device 4, such as the driving circuit, the sampling circuit and the absorbing circuit, may be arranged on the second circuit board, and one or more of the circuit elements which has larger size or is electrically connected to and far from the power device 4, such as a control circuit and the bus capacitor, may be arranged on the first circuit board 1.

It can be understood that when the number of circuit elements on the first circuit board 1 and the second circuit board 2 is large, a third circuit board can be arranged, and any one or more of circuit elements, such as the driving circuit, the sampling circuit, the absorbing circuit, the control circuit and the bus capacitor, can be arranged on the third circuit board. The power module can be provided with multiple circuit boards according to actual needs. Where the third circuit board may be an electrolytic capacitor board or a control board, etc., and the third circuit board may be independently arranged, or may be arranged on the second surface of the first circuit board 1 to reduce space occupied by each part inside the power module.

Embodiment II

Figure 4:
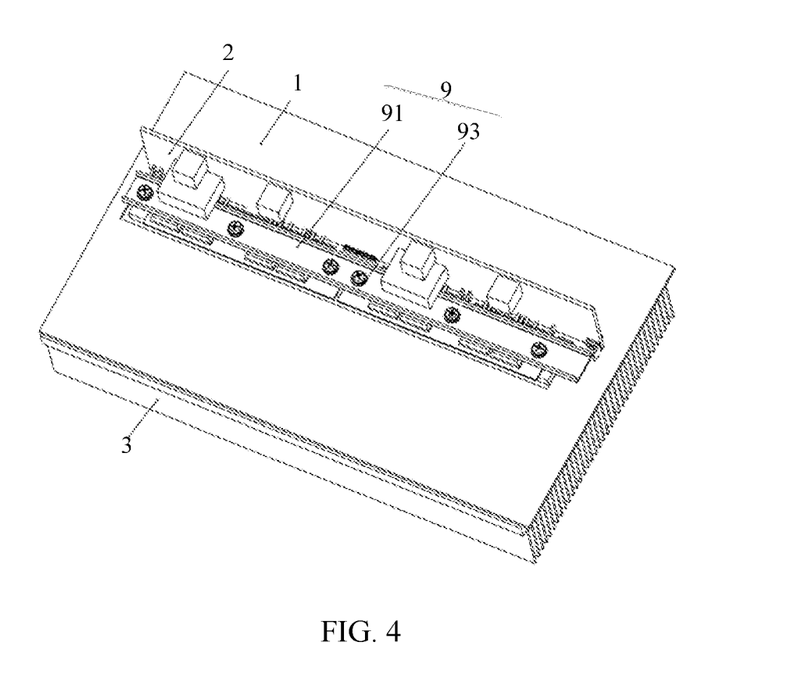
FIG. 4 is a schematic diagram of a first structural of the power module according to Embodiment II of the present utility model.
Figure 5:
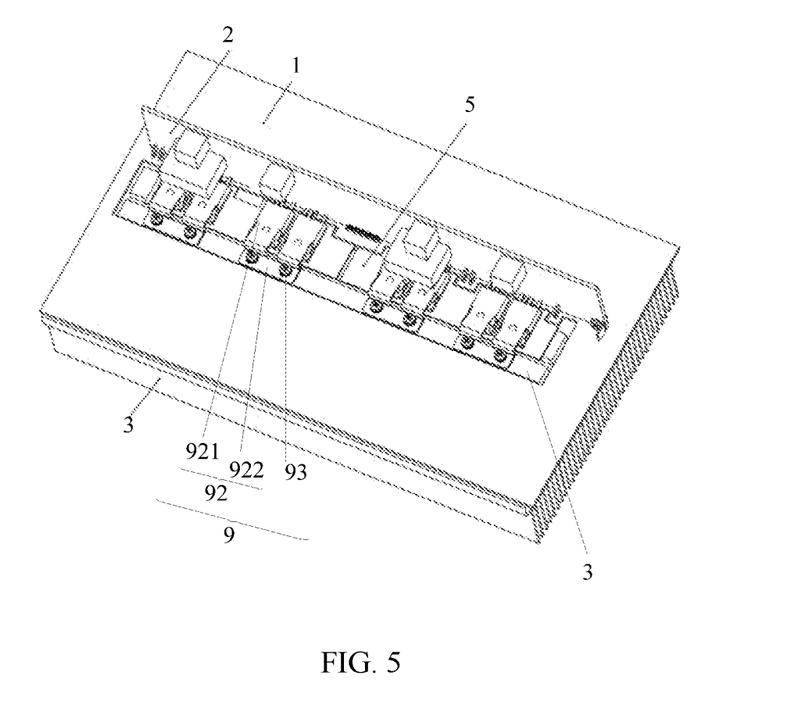
FIG. 5 is a schematic diagram of a second structural of the power module according to Embodiment II of the present utility model.
Figure 6:
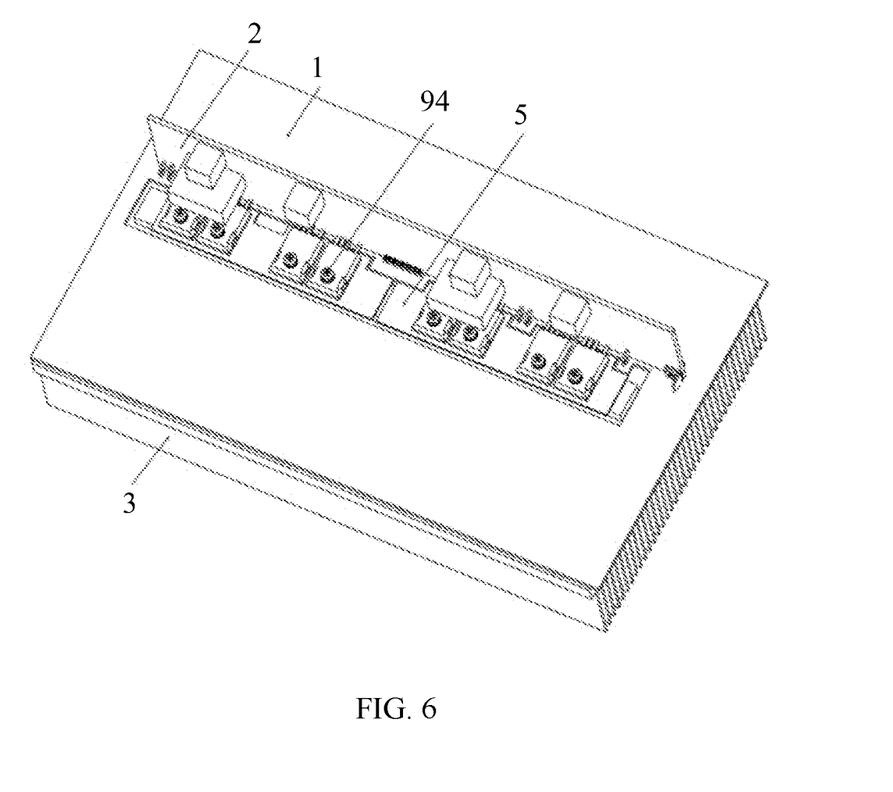
FIG. 6 is a schematic diagram of a third structural of the power module according to Embodiment II of the present utility model.

FIG. 4 is a schematic diagram of a first structural of the power module according to Embodiment II; FIG. 5 is a schematic diagram of a second structural of the power module according to Embodiment II; FIG. 6 is a schematic diagram of a third structural of the power module according to Embodiment II.

Referring to FIG. 4 to FIG. 6, on the basis of Embodiment I above, in order to achieve a closer contact between the switch tube 41 of power device 4 and the radiator 3, the power module provided by this embodiment also includes a fastener 9, the fastener 9 is configured to fix the switch tube 41 to the radiator 3.

In this embodiment, the fastener 9 is configured to further fix the switch tube 41 to the radiator 3, so that the heat of the switch tube 41 is effectively transferred the to radiator 3, thereby achieving effective heat dissipation of the switch tube 41.

The fastener 9 may have a variety of structures. For example, the fastener 9 may include a pressing part and a fixing part, and at least partially of the pressing part is pressed against and hold on one side of the switch tube 41 facing away from the radiator 3, and the fixing part is configured to fix the pressing part to the radiator 3.

Specifically, in order to make the contact between the switch tube 41 and the radiator 3 more tight, the switch tube 41 is first pressed against and hold on the radiator 3 by the pressing part, and the pressing part is then fixed to the radiator 3 by the fixing part. The cooperation of the pressing part and the fixing part effectively improves the connection tightness between the switch tube 41 and radiator 3, and ensures the heat dissipation effect of the radiator 3 on the switch tube 41.

Referring to FIG. 4, where the pressing part may be a pressing strip 91, the fixing part may be a bolt 93, and the bolt 93 is fixed to the radiator 3 by the pressing strip 91. When the fixing is performed, the pressing strip 91 is pressed on the surface of the plurality of the switch tubes 41 facing away from the radiator 3 along the longitudinal direction of the second circuit board 2, and the pressing strip 91 is then fixed onto the radiator 3 by the bolt 93, where the bolt 93 can pass through the gap between each two of the plurality of the switch tubes 41 and then can be fixed onto the radiator 3.

Referring to FIG. 5, the pressing part may also be a elastic piece 92, and the fixing part is the bolt 93; where the elastic piece 92 includes a free end 921 and a fastening end 922; the free end 921 is pressed against and hold on one side of the switch tube 41 facing away from the radiator 3, so that the switch tube 41 is in close contact with the radiator 3; the fastening end 922 is fixed on the radiator 3 by the bolt 93, ensuring the stable connection between the elastic piece 92 and the radiator 3. In other embodiments, a plurality of the switch tubes 41 may share one elastic piece 92.

In order to ensure the insulation effect between the pressing strip 91 and the switch tube 41 or between the elastic piece 92 and the switch tube 41, respectively, an insulating gasket is arranged between the contact surface of the pressing strip 91 and the switch tube 41, and between the contact face of the elastic piece 92 and the switch tube 41.

Referring to FIG. 6, the fastener 9 in this embodiment may also be a screw 94, the screw 94 is fixed to the radiator 3 by passing through the switch tube 41, so that the heat dissipation surface of the switch tube 41 is in closely contacts with the radiator 3, ensuring the heat dissipation effect of the radiator 3 on the switch tube 41.

Other technical features are the same as those in Embodiment I, can achieve same or similar technical effects, and will not be further described herein. For details, please refer to the description of Embodiment I.

The embodiment of the present utility model further provides an electronic device including the power module according to each of the above embodiments. In this power module, by arranging the radiator on the first surface of the first circuit board, arranging the second circuit board on the second surface of the first circuit board, and arranging the power device on the second circuit board, to enable thermal contact between the heat dissipation surface of the power device and the radiator, and to make the heat dissipation surface of the power device parallel to the first surface of the first circuit board, this arrangement shortens the heat dissipation path of the power device, efficiently improves the heat dissipation efficiency of the power device, and further reduces the working temperature of the power module in this electronic device; at the same time, the arrangement of the second circuit board also makes the assembly of the entire power module more convenient, further improving the work efficiency.

Finally, it should be noted that the above embodiments are only used to illustrate the technical solutions of the present utility model, and are not limited thereto; although the present utility model has been described in detail with reference to the above embodiments, those skilled in the art should understand that they may still modify the technical solutions described in each of the above embodiments, or conduct equivalent replacement on some or all of the technical features of the technical solutions; and the modifications or substitutions do not make the nature of the corresponding technical solutions deviate from the scope of the technical solutions of each of the embodiments of the utility model.

What is claimed is:

1. A power module, comprising: a first circuit board, a second circuit board, a radiator and a power device;
   the radiator is arranged on a first surface of the first circuit board, the second circuit board is mounted on a second surface of the first circuit board, and the first surface of the first circuit board and the second surface of the first circuit board are arranged oppositely;
   the power device is perpendicularly inserted on a first surface of the second circuit board and is electrically connected to the first circuit board through the second circuit board, and the first surface of the first circuit board is perpendicular to the first surface of the second circuit board;
   wherein a surface of the power device is in thermal contact with the radiator, the surface of the power device is a heat dissipation surface of the power device, and the heat dissipation surface of the power device is parallel to the first surface of the first circuit board,
   wherein the surface of the power device is a maximum area surface of the power device.

2. The power module according to claim 1, wherein the power device comprises a switch tube, and the heat dissipation surface of the switch tube is in thermal contact with the radiator via an insulating thermal conductive gasket.

3. The power module according to claim 2, wherein the power module further comprises a fastener, the fastener is configured to fix the switch tube to the radiator.

4. The power module according to claim 3, wherein the fastener comprises a pressing part and a fixing part, the pressing part is at least partially pressed against and held on one side of the switch tube facing away from the radiator, and the fixing part is configured to fix the pressing part to the radiator.

5. The power module according to claim 4, wherein the pressing part is a pressing strip, the fixing part is a bolt, and the bolt passes through the pressing strip and is fixed to the radiator.

6. The power module according to claim 4, wherein the fixing part is a bolt; the pressing part is an elastic piece, and the elastic piece comprises a free end and a fastening end; the fastening end is fixed on the radiator by the bolt, and the free end is pressed against and held on one side of the switch tube facing away from the radiator.

7. The power module according to claim 3, wherein the fastener is a screw, and the screw passes through the switch tube and is fixed to the radiator.

8. The power module according to claim 2, wherein a plurality of switch tubes are arranged along a bottom edge of the first surface of the second circuit board.

9. The power module according to claim 1, wherein an interior of the first circuit board has an opening, at least part of the heat dissipation surface of the power device extends into the opening.

10. The power module according to claim 1, wherein at least part of the heat dissipation surface of the power device extends beyond an edge of the first circuit board.

11. The power module according to claim 1, wherein an edge of the first circuit board has an opening, at least part of the heat dissipation surface of the power device extends into the opening.

12. The power module according to claim 1, wherein the second circuit board comprises a power terminal, and the second circuit board is mounted on the second surface of the first circuit board by the power terminal and is electrically connected to the first circuit board.

13. The power module according to claim 1, wherein the second circuit board further comprises a signal terminal for transmitting signals between the first circuit board and the second circuit board.

14. The power module according to claim 1, wherein the second circuit board further comprises a fixing terminal for enhancing mechanical connection strength between the first circuit board and the second circuit board.

15. The power module according to claim 14, wherein the fixed terminal is disposed at each end of the second circuit board.

16. The power module according to claim 1, wherein the radiator has a protrusion, and the heat dissipation surface of the power device is in thermal contact with the top surface of the protrusion.

17. The power module according to claim 1, wherein the power module further comprises a driving circuit, a sampling circuit and an absorbing circuit, and any one or more of the driving circuit, the sampling circuit and the absorbing circuit are arranged on the second circuit board.

18. The power module according to claim 1, wherein the power module further comprises a control circuit and a bus capacitor, and the control circuit and the bus capacitor are arranged on the first circuit board.

19. An electronic device, comprising the power module according to claim 1.

* * * * *